US012652778B2

(12) United States Patent
Shi et al.

(10) Patent No.: US 12,652,778 B2
(45) Date of Patent: Jun. 9, 2026

(54) ELECTRONIC DEVICE

(71) Applicant: Telefonaktiebolaget LM Ericsson (publ), Stockholm (SE)

(72) Inventors: Xiu Shi, Beijing (CN); Haichao Zhao, Beijing (CN); Xiaodong Tang, Beijing (CN); Wei Zhang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 18/861,758

(22) PCT Filed: Jun. 15, 2023

(86) PCT No.: PCT/CN2023/100365
§ 371 (c)(1),
(2) Date: Oct. 30, 2024

(87) PCT Pub. No.: WO2024/066486
PCT Pub. Date: Apr. 4, 2024

(65) Prior Publication Data
US 2025/0301589 A1     Sep. 25, 2025

(51) Int. Cl.
H05K 7/20          (2006.01)
F04D 25/16          (2006.01)
(Continued)

(52) U.S. Cl.
CPC ....... H05K 7/20172 (2013.01); F04D 25/166 (2013.01); F04D 29/601 (2013.01);
(Continued)

(58) Field of Classification Search
CPC .... F04D 25/166; F04D 29/601; F04D 29/668; H05K 7/20171; G06F 1/183; G06F 1/20
See application file for complete search history.

(56) References Cited

U.S. PATENT DOCUMENTS 6,351,380 B1    2/2002  Curlee et al.
7,379,300 B1 *  5/2008  Chen .................. H05K 7/20172
                                                   165/122
(Continued)

FOREIGN PATENT DOCUMENTS

CN        101742876 A      6/2010
CN        102235409 A      11/2011
(Continued)

OTHER PUBLICATIONS

Scopelliti, David P, "The Pain of Fretting Corrosion", SamTec, Inc., Apr. 23, 2013, 8 pages.

*Primary Examiner* — Patrick F Marinelli
(74) *Attorney, Agent, or Firm* — Murphy, Bilak & Homiller, PLLC

(57) ABSTRACT

The present disclosure discloses an electronic device. The electronic device comprises a first part, a second part and a connecting structure, the connecting structure comprises a first connector arranged on the first part and a second connector arranged on the second part, the electronic device further comprises at least one vibration absorbing structure, the vibration absorbing structure comprises elastic material arranged on the first part or the second part, wherein when the first part and the second part are connected by the connecting structure, the elastic material is compressed in a direction which is parallel to the direction in which the first connector and the second connector are connected with each other, such that a damping connection is established between the first part and the second part. The electronic device can achieve good vibration absorbing performance, low cost and high durability.

9 Claims, 4 Drawing Sheets

(51) Int. Cl.

| | | |
|---|---|---|
| *F04D 29/60* | (2006.01) | |
| *F04D 29/66* | (2006.01) | |
| *G06F 1/183* | (2026.01) | |
| *G06F 1/20* | (2006.01) | |

(52) U.S. Cl.
CPC ........... *F04D 29/668* (2013.01); *G06F 1/183* (2013.01); *G06F 1/20* (2013.01)

(56)     References Cited

U.S. PATENT DOCUMENTS

| | | |
|---|---|---|
| 10,912,216 B1 | 2/2021 | Hong et al. |
| 2006/0029492 A1 | 2/2006 | Kao |

FOREIGN PATENT DOCUMENTS

| | | |
|---|---|---|
| CN | 104185405 A | 12/2014 |
| CN | 204755410 U | 11/2015 |
| WO | 2010138824 A2 | 12/2010 |
| WO | 2010138824 A3 | 2/2011 |

* cited by examiner

ELECTRONIC DEVICE

TECHNICAL FIELD

The present disclosure generally relates to electronic device, and more particularly, to an electronic device having a vibration absorbing structure.

BACKGROUND

This section introduces aspects that may facilitate better understanding of the present disclosure. Accordingly, the statements of this section are to be read in this light and are not to be understood as admissions about what is in the prior art or what is not in the prior art.

In an electronic device, different parts of the electronic device usually need to be connected by a connecting structure, so as to establish mechanical and electrical connection between the different parts. The connecting structure usually comprises a plurality of connectors which are arranged on different parts of the electronic device and can be connected with each other. For example, a first connector arranged on a first part of the electronic device and a second connector arranged on a second part of the electronic device.

During the operation of an electronic device, vibration often occurs. For example, forced air cooling is widely used in electronic device. Many kinds of electronic device use fans to enhance heat dissipation. Fans are usually arranged in a fan tray. A fan tray usually integrates a couples of fans, a control board, a connector together with mechanical parts. A fan tray is usually designed to be mounted on a specific electronic device. When a fan tray is assembled with an electronic device, mechanical and electrical connection is usually built between the fan tray and the chassis of the electronic device through a connecting structure, which comprises a first connector arranged on the fan tray and a second connector arranged on the chassis. During operation, the rotor of the fans keeps rotating, and the rotation of rotor inevitably leads to vibration. Vibration is destructive to electronic device. It may cause component deformation or crack, fastening piece loose, interconnecting break, etc. The most common failure is the interconnecting break caused by the wear of the connecting structure.

Researchers have made quite a few studies on the failure mechanism of connectors. They concluded that in electronic connectors, fretting motion (relative micro-motion between the mating connectors) can lead to fretting wear (wear through the surface plating), which further results in fretting corrosion (generate highly resistive corrosive products in the contact interface). The interconnecting between connectors fails when fretting corrosion reaches to certain level. Vibration can cause the two mating connectors to move relative to one another, which are the source of the fretting motion. The fretting motion can be very small, in the thousandths of an inch range, and can be very destructive to the fretting surfaces.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

The object of the disclosure is to provide an electronic device, which can achieve good vibration absorbing performance, low cost and high durability.

According to a first aspect of the disclosure, there is provided an electronic device, comprises a first part, a second part and a connecting structure, the connecting structure comprises a first connector arranged on the first part and a second connector arranged on the second part, the electronic device further comprises at least one vibration absorbing structure, the vibration absorbing structure comprises elastic material arranged on the first part or the second part, wherein when the first part and the second part are connected by the connecting structure, the elastic material is compressed in a direction which is parallel to the direction in which the first connector and the second connector are connected with each other, such that a damping connection is established between the first part and the second part.

In an embodiment of the disclosure, when the first part and the second part are connected by the connecting structure, the elastic material does not generate a force that deviates the first connector and the second connector from a mating position in a direction other than the direction in which the first connector and the second connector are connected with each other.

In an embodiment of the disclosure, before the elastic material is compressed, the surface of the elastic material is flat, concave or convex.

In an embodiment of the disclosure, the elastic material is rubber, silica gel, latex, plastic, sponge or spring.

In an embodiment of the disclosure, the vibration absorbing structure comprises a first component arranged on one of the first part and the second part and a second component arranged on the other one of the first part and the second part, the first component comprises the elastic material, the second component is configured to compress the elastic material when the first part and the second part are connected by the connecting structure.

In an embodiment of the disclosure, the first component is a retaining sleeve with the elastic material arranged inside and at the bottom of the retaining sleeve; and the second component is a guide pin, the tip of the guide pin compresses the elastic material when the first part and the second part are connected by the connecting structure.

In an embodiment of the disclosure, the elastic material is pressed to the bottom of the retaining sleeve and self-sustain; or the elastic material is sticked to the bottom of the retaining sleeve by glue.

In an embodiment of the disclosure, the first component is an anti-vibration block made of the elastic material; and the second component is one of a guide pin and a retaining sleeve, the tip of the guide pin or the retaining sleeve compresses the anti-vibration block when the first part and the second part are connected by the connecting structure.

In an embodiment of the disclosure, the first component is an anti-vibration block made of the elastic material; and the second component is a protrusion with a contacting plane, the contacting plane of the protrusion compresses the anti-vibration block when the first part and the second part are connected by the connecting structure.

In an embodiment of the disclosure, the first connector and one of the first component and the second component are arranged on a same side of the first part; and the second connector and the other one of the first component and the second component are arranged on a same side of the second part.

In an embodiment of the disclosure, one of the first part and the second part is a backplane of a chassis and the other one of the first part and the second part is a fan tray, wherein one of the first component and the second component is arranged on the backplane, and the other one of the first component and the second component is arranged on a surface of the fan tray facing the backplane.

In an embodiment of the disclosure, the first component comprises a protrusion with a contacting plane and an anti-vibration block made of the elastic material, the anti-vibration block is attached on the contacting plane of the protrusion; and the second component is a contacting surface of the first part or the second part, the contacting surface compresses the anti-vibration block when the first part and the second part are connected by the connecting structure.

In an embodiment of the disclosure, when the first component is arranged on the first part, the first component and the first connector are arranged on a same side of the first part; and when the first component is arranged on the second part, the first component and the second connector are arranged on a same side of the second part.

In an embodiment of the disclosure, one of the first part and the second part is a backplane of a chassis and the other one of the first part and the second part is a fan tray, wherein the first component is arranged on a first one of the backplane and the fan tray, and the second component is a contacting surface of the other one of backplane and the fan tray facing the first one.

BRIEF DESCRIPTION OF THE DRAWINGS

These and other objects, features and advantages of the disclosure will become apparent from the following detailed description of illustrative embodiments thereof, which are to be read in connection with the accompanying drawings, in which.

DETAILED DESCRIPTION

Figure 1:
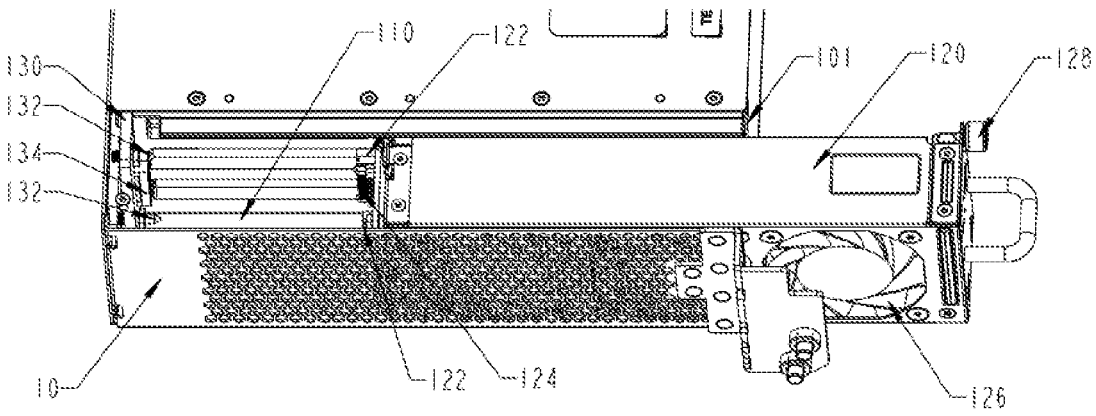
FIGS. 1, 2 and 3 show an electronic device according to a first embodiment of the disclosure.

The embodiments of the present disclosure are described in detail with reference to the accompanying drawings. It should be understood that these embodiments are discussed only for the purpose of enabling those skilled in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. Those skilled in the relevant art will recognize that the disclosure may be practiced without one or more of the specific features or advantages of a particular embodiment. In other instances, additional features and advantages may be recognized in certain embodiments that may not be present in all embodiments of the disclosure.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Generally, there are two methods to reduce the influences of fretting corrosion on the connecting structure. One is to make the connecting structure robust, such as rugged mechanical structure, thick noble metal plating, and lubricating the contact. The other one is to add elastic material around the vibrating component in a direction other than the direction in which the first connector and the second connector are connected with each other to absorb the vibration. However, although making the connecting structure robust can increase durability, it will also increase the cost greatly (30% or more). Moreover, although adding elastic material can reduce the vibration, since the elastic material are added in a direction other than the direction in which the first connector and the second connector are connected with each other, the elastic material will generate a force that deviates the mating connectors from a mating position, thus reducing the durability of the connecting structure and the electronic device.

Therefore, there is a need to design an electronic device with good vibration absorbing performance, low cost and high durability.

The core inventive concept of the present application is that: the electronic device not only comprises a connecting structure, but also comprises a vibration absorbing structure comprising elastic material and a component for compressing the elastic material. When different parts of the electronic device are connected by the connecting structure, the elastic material is compressed by the component in a direction substantially parallel to the direction in which the mating connectors of the connecting structure are connected with each other, such that a damping connection is established between different parts of the electronic device. The vibration absorbing structure not only absorbs vibration along the direction in which the mating connectors are connected, but also absorbs vibration along other directions, such as vibration along a direction perpendicular to the direction in which the mating connectors are connected. Therefore, the damping connection resists any relative movement between different parts of the electronic device, such that the vibration on the connecting structure is greatly reduced. Moreover, since the elastic material is compressed in a direction substantially parallel to the direction in which the mating connectors are connected, the elastic material does not generate a force that deviates the mating connectors from a mating position in a direction other than the direction in which the mating connectors are connected with each other, thereby increasing the durability of the connecting structure and the electronic device. Furthermore, compared with existing electronic device, the electronic device of the present application only further comprises the elastic material, thus the cost of the electronic device is low.

Those skilled in the art can understand that the elastic material can be any appropriate material that is suitable for absorbing vibration, such as rubber, silica gel, latex, plastic, sponge or spring, and these variations do not exceed the protection scope of the present application.

Figure 2:
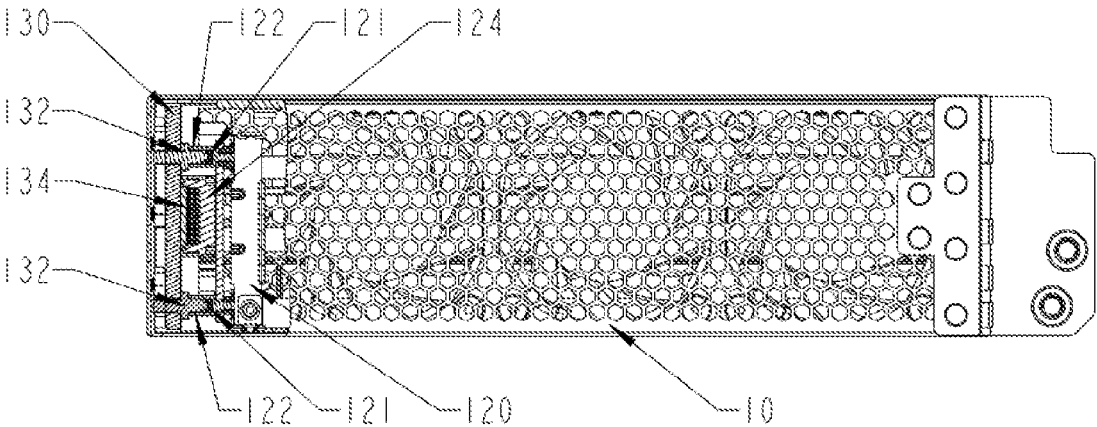
Figure 3:
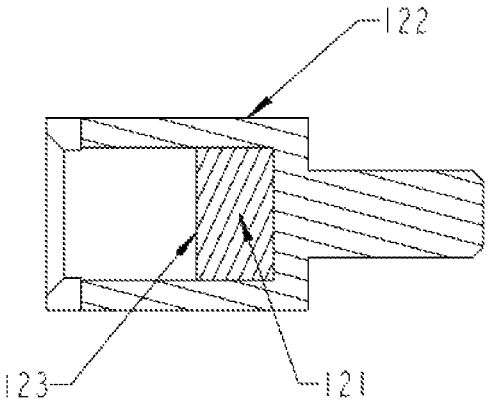

FIGS. 1, 2 and 3 show an electronic device according to a first embodiment of the disclosure. Specifically, FIG. 1 shows a part perspective view of the electronic device before it is assembled, FIG. 2 shows a part sectioned perspective view of the electronic device after it is assembled, and FIG. 3 shows a part sectioned perspective view of a retaining sleeve arranged in the electronic device, wherein the retaining sleeve comprises elastic material arranged at the bottom thereof.

As shown in FIGS. 1, 2 and 3, the electronic device comprises a chassis 10 and a fan tray 120. The chassis 10 has a slot 110 to accommodate the fan tray 120. The chassis 10 comprises a backplane 130. The backplane 130 has two guide pins 132 and a connector 134. Correspondingly, the fan tray 120 has two retaining sleeves 122 and a connector 124 arranged on a surface facing the backplane 130. The fan tray 120 also has three fans 126 which are the sources of vibration. There's a screw 128 on fan tray 120 to fix with the screw hole 101 in the chassis 10. A piece of elastic material 121 is added at the bottom of the retaining sleeves 122. Those skilled in the art can understand that the elastic material 121 can be added to the bottom of the retaining sleeves 122 in any appropriate way, and these variations do not exceed the protection scope of the present application. For example, the elastic material 121 can be pressed to the bottom of the retaining sleeves 122 and self-sustain, or sticked to the bottom of the retaining sleeves 122 by glue. As shown in FIG. 3, the front side 123 of the elastic material 121 is flat. However, those skilled in the art can understand that the front side 123 of the elastic material 121 can also be concave or convex before the elastic material 121 is compressed, and these variations do not exceed the protection scope of the present application.

After the electronic device is assembled, the screw 128 on the fan tray 120 is engaged with the screw hole 101 in the chassis 10, the connector 134 on the backplane 130 is mated with the connector 124 on the fan tray 120, and the guide pins 132 are accommodated in the retaining sleeves 122. During the process of the fan tray 120 inserting into the slot 110, the guide pins 132 engage with the retaining sleeves 122, so as to guide the connector 124 on the fan tray 120 and the counterpart connector 134 on the backplane 130 mating correctly. Then, when further inserting the fan tray 120 till the two connectors 124 and 134 full mated, the tips of the guide pins 132 touch and compress the elastic material 121 at the bottom of retaining sleeves 122. The guide pins 132, the elastic material 121 and the retaining sleeves 122 together form a vibration absorbing structure so as to build a damping connection between the fan tray 120 and the backplane 130 of the chassis 10. The damping connection resists any relative movement between the fan tray 120 and the backplane 130, such that the vibration on the connectors 124 and 134 is greatly reduced. When there's vibration generated by fans during operation, the vibration absorbing structure can attenuate the vibration, and the fretting motion between the connectors 124 and 134 can be reduced greatly. Thus, the risk of fretting corrosion between the connectors 124 and 134 is reduced.

Moreover, since the elastic material 121 is added at the bottom of the retaining sleeve 122, the elastic material 121 is compressed in a direction substantially parallel to the direction in which the connectors 124 and 134 are connected with each other. Therefore, the elastic material 121 does not generate a force that deviates the connectors 124 and 134 from a mating position in a direction other than the direction in which the connectors 124 and 134 are connected with each other, thereby increasing the durability of the connecting structure and the electronic device. As shown in FIGS. 1, 2 and 3, the guide pins 132 and the connector 134 are arranged on a same side of the backplane 130, and the retaining sleeves 122 and the connector 124 are arranged on a same side of the fan tray 120, such that the compression on the elastic material 121 in the desired direction, which is parallel to the direction in which the connectors 124 and 134 are connected, can be easily achieved. Since the elastic material 121 is compressed in a direction substantially parallel to the direction in which the connectors 124 and 134 are connected with each other, the damping connection is established mainly along this direction.

Figure 4:
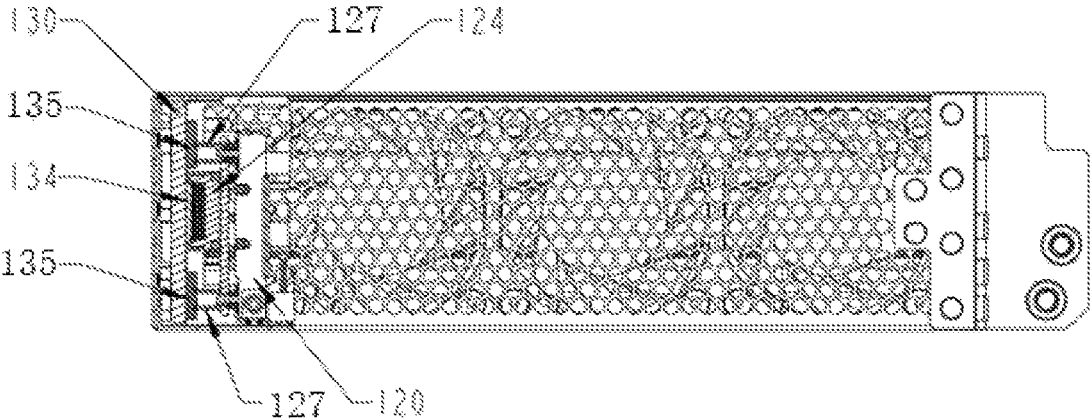
FIG. 4 shows an electronic device according to a second embodiment of the disclosure.

FIG. 4 shows an electronic device according to a second embodiment of the disclosure. As shown in FIG. 4, compared with the first embodiment of the disclosure, the guide pins 132 and retaining sleeves 122 in FIGS. 1, 2 and 3 are replaced by anti-vibration blocks 135 and retaining sleeves 127. The anti-vibration blocks 135 are made of elastic material. When the fan tray 120 fully seated in the slot 110, the tips of the retaining sleeves 127 compress the anti-vibration blocks 135. Therefore, the retaining sleeves 127 on the fan tray 120 build damping connection with the backplane 130 through the anti-vibration blocks 135. Then, when there's vibration generated by the fan tray 120, the anti-vibration blocks 135 absorb much of the vibration, thus attenuating the fretting corrosion between the connectors 124 and 134. Moreover, similar to the first embodiment of the disclosure, since the anti-vibration blocks 135 is compressed in a direction substantially parallel to the direction in which the connectors 124 and 134 are connected with each other, the anti-vibration blocks 135 do not generate a force that deviates the connectors 124 and 134 from a mating position in a direction other than the direction in which the connectors 124 and 134 are connected with each other, thereby increasing the durability of the connecting structure and the electronic device. Although it is shown in FIG. 4 that the anti-vibration blocks 135 are arranged on the backplane 130, the anti-vibration blocks 135 can also be arranged on other parts of the chassis 10, such as an enclosure.

Figure 5:
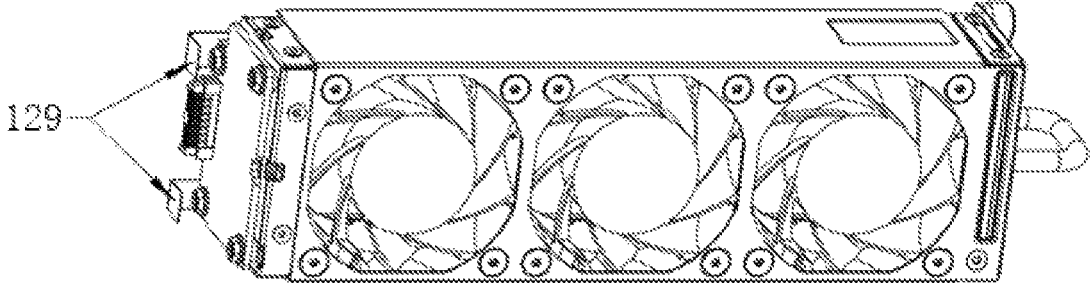
FIGS. 5 and 6 show an electronic device according to a third embodiment of the disclosure.
Figure 6:
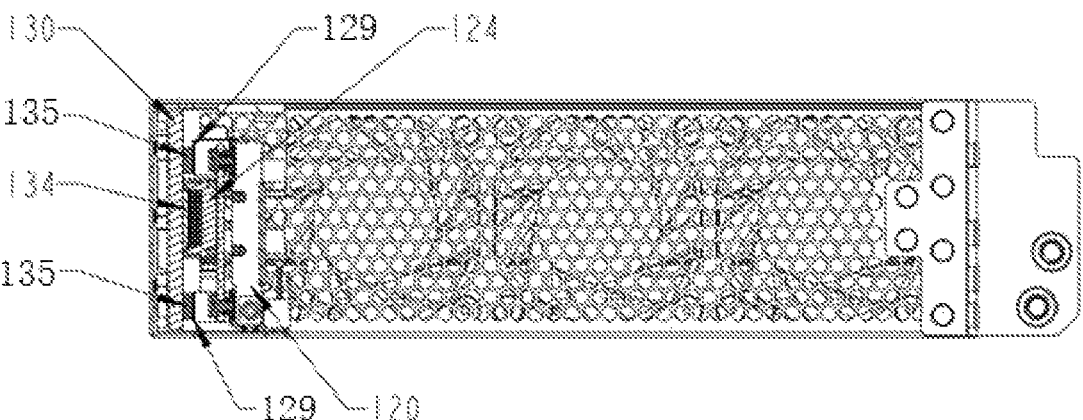

Those skilled in the art can understand that the retaining sleeves 122 in FIG. 4 can be replaced by any appropriate structure that is suitable for compressing the anti-vibration blocks 135, such as a guide pin or a protrusion as shown in FIGS. 5 and 6.

FIGS. 5 and 6 shows an electronic device according to a third embodiment of the disclosure. Specifically, FIG. 5 shows a part perspective view of the electronic device, and FIG. 6 shows a part sectioned perspective view of the electronic device. As shown in FIGS. 5 and 6, compared with the second embodiment of the disclosure, the retaining sleeves 127 in FIG. 4 are replaced by protrusions 129. Although it is shown in FIGS. 5 and 6 that the protrusions 129 are arranged at two corners on the surface of the fan tray 120 facing the backplane 130, the protrusions 129 can be arranged at other positions on this surface, as long as the protrusions 129 and the anti-vibration blocks 135 can cooperate with each other. Preferably, the protrusions 129 are symmetrical with respect to the connector 124. The protrusions 129 can be a part of the enclosure of the fan tray or small pillars fixed on the fan tray. Two anti-vibration blocks 135 made of elastic material are attached on the backplane 130. When the fan tray 120 fully seated in the slot 110, contacting plane of the protrusions 129 compress the anti-vibration blocks 135. Therefore, a damping connection can be built between the fan tray 120 and the backplane 130 through the protrusions 129 and the anti-vibration blocks 135. When there's vibration generated on the fan tray 120, the anti-vibration blocks 135 can absorb much of the vibration, thus attenuating the fretting corrosion between the connectors 124 and 134. Moreover, similar to the first and second embodiments of the disclosure, since the anti-vibration blocks 135 is compressed in a direction substantially parallel to the direction in which the connectors 124 and 134 are connected with each other, the anti-vibration blocks 135 do not generate a force that deviates the connectors 124 and 134 from a mating position in a direction other than the direction in which the connectors 124 and 134 are connected with each other, thereby increasing the durability of the connecting structure and the electronic device. Although it is shown in FIG. 6 that the anti-vibration blocks 135 are arranged on the backplane 130, the anti-vibration blocks 135 can also be arranged on other parts of the chassis 10, such as an enclosure.

Figure 7:
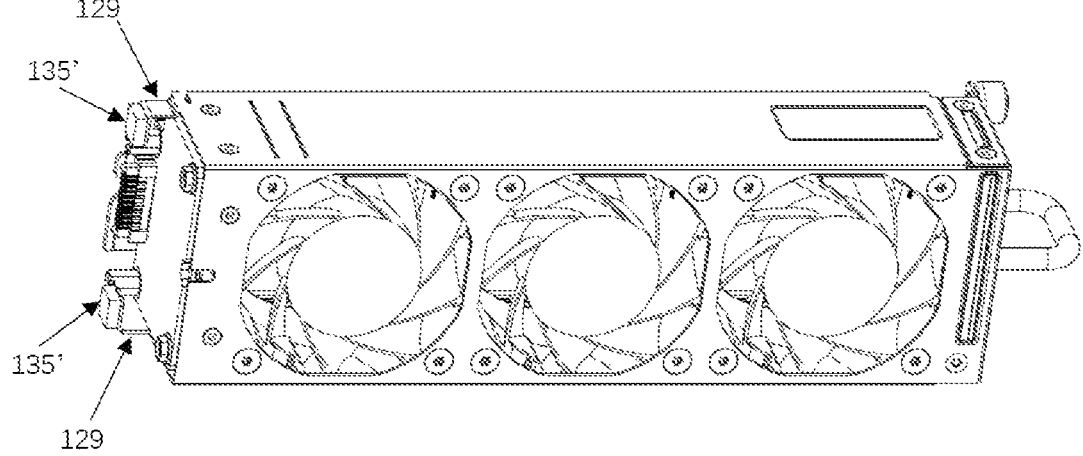
FIG. 7 shows an electronic device according to a fourth embodiment of the disclosure.

FIG. 7 shows an electronic device according to a fourth embodiment of the disclosure. Specifically, FIG. 7 shows a part perspective view of the electronic device. As shown in FIG. 7, compared with the third embodiment of the disclosure, the anti-vibration blocks 135 which arranged on the backplane 130 in the third embodiment are replaced by anti-vibration blocks 135' attached on the contacting plane of the protrusion 129. Those skilled in the art can understand that the anti-vibration block 135' can be attached on the contacting plane of the protrusion 129 in any appropriate way, and these variations do not exceed the protection scope of the present application. For example, the anti-vibration block 135' can be attached on the contacting plane of the protrusion 129 by glue. When the fan tray 120 fully seated in the slot 110, a contacting surface of the backplane 130 (i.e., the surface of the backplane 130 facing the fan tray 120) compress the anti-vibration blocks 135'. Therefore, a damping connection can be built between the fan tray 120 and the backplane 130. When there's vibration generated on the fan tray 120, the anti-vibration blocks 135' can absorb much of the vibration, thus attenuating the fretting corrosion between the connectors 124 and 134. Moreover, similar to the first, second and third embodiments of the disclosure, since the anti-vibration blocks 135' are compressed in a direction substantially parallel to the direction in which the connectors 124 and 134 are connected with each other, the anti-vibration blocks 135' do not generate a force that deviates the connectors 124 and 134 from a mating position in a direction other than the direction in which the connectors 124 and 134 are connected with each other, thereby increasing the durability of the connecting structure and the electronic device.

Those skilled in the art can understand that, the arrangement positions of the interacting components of the vibration absorbing structure in the first, second, third and fourth embodiment can be exchanged with each other. For example, in the first embodiment, the guide pins 132 can be modified to be arranged on the fan tray 120, and the retaining sleeves 122 can be modified to be arranged on the backplane 130. These variations do not exceed the protection scope of the present application.

References in the present disclosure to "an embodiment", "another embodiment" and so on, indicate that the embodiment described may include a particular feature, structure, or characteristic, but it is not necessary that every embodiment includes the particular feature, structure, or characteristic.

Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. An electronic device comprising:
   a first part;
   a second part; and
   a connecting structure comprising a first connector arranged on the first part and a second connector arranged on the second part;
   wherein the electronic device further comprises at least one vibration absorbing structure, the vibration absorbing structure comprising elastic material arranged on the first part or the second part; and
   wherein when the first part and the second part are connected by the connecting structure, the elastic material is compressed in a direction which is parallel to the direction in which the first connector and the second connector are connected with each other, such that a damping connection is established between the first part and the second part,
   wherein the vibration absorbing structure comprises a first component arranged on one of the first part and the second part and a second component arranged on the other one of the first part and the second part, the first component comprises the elastic material, and the second component is configured to compress the elastic material when the first part and the second part are connected by the connecting structure, and wherein:

the first component is a retaining sleeve with the elastic material arranged inside and at the bottom of the retaining sleeve; and the second component is a guide pin, and wherein the tip of the guide pin compresses the elastic material when the first part and the second part are connected by the connecting structure.

2. The electronic device according to claim 1, wherein when the first part and the second part are connected by the connecting structure, the elastic material does not generate a force that deviates the first connector and the second connector from a mating position in a direction other than the direction in which the first connector and the second connector are connected with each other.

3. The electronic device according to claim 1, wherein before the elastic material is compressed, the surface of the elastic material is flat, concave or convex.

4. The electronic device according to claim 1, wherein the elastic material is rubber, silica gel, latex, plastic, sponge, or a spring.

5. The electronic device according to claim 1, wherein: the elastic material is pressed to the bottom of the retaining sleeve and self-sustain; or the elastic material is stuck to the bottom of the retaining sleeve by glue.

6. An electronic device comprising:

a first part;

a second part; and a connecting structure comprising a first connector arranged on the first part and a second connector arranged on the second part;

wherein the electronic device further comprises at least one vibration absorbing structure, the vibration absorbing structure comprising elastic material arranged on the first part or the second part, wherein when the first part and the second part are connected by the connecting structure, the elastic material is compressed in a direction which is parallel to the direction in which the first connector and the second connector are connected with each other, such that a damping connection is established between the first part and the second part, wherein the vibration absorbing structure comprises a first component arranged on one of the first part and the second part and a second component arranged on the other one of the first part and the second part, the first component comprises the elastic material, and the second component is configured to compress the elastic material when the first part and the second part are connected by the connecting structure, and wherein:

the first component is an anti-vibration block made of the elastic material; and the second component is one of a guide pin and a retaining sleeve, the tip of the guide pin or the retaining sleeve compresses the anti-vibration block when the first part and the second part are connected by the connecting structure.

7. An electronic device comprising:

a first part;

a second part; and a connecting structure comprising a first connector arranged on the first part and a second connector arranged on the second part;

wherein the electronic device further comprises at least one vibration absorbing structure, the vibration absorbing structure comprising elastic material arranged on the first part or the second part, wherein when the first part and the second part are connected by the connecting structure, the elastic material is compressed in a direction which is parallel to the direction in which the first connector and the second connector are connected with each other, such that a damping connection is established between the first part and the second part, wherein the vibration absorbing structure comprises a first component arranged on one of the first part and the second part and a second component arranged on the other one of the first part and the second part, the first component comprises the elastic material, and the second component is configured to compress the elastic material when the first part and the second part are connected by the connecting structure, and wherein:

the first component comprises a protrusion with a contacting plane and an anti-vibration block made of the elastic material, the anti-vibration block is attached on the contacting plane of the protrusion; and the second component is a contacting surface of the first part or the second part, the contacting surface compresses the anti-vibration block when the first part and the second part are connected by the connecting structure.

8. The electronic device according to claim 7, wherein: when the first component is arranged on the first part, the first component and the first connector are arranged on a same side of the first part; and when the first component is arranged on the second part, the first component and the second connector are arranged on a same side of the second part.

9. The electronic device according to claim 7, wherein one of the first part and the second part is a backplane of a chassis and the other one of the first part and the second part is a fan tray, wherein the first component is arranged on a first one of the backplane and the fan tray, and the second component is a contacting surface of the other one of backplane and the fan tray facing the first one.

* * * * *